(12) United States Patent
Plecher et al.

(10) Patent No.: US 7,394,184 B2
(45) Date of Patent: Jul. 1, 2008

(54) SEALING ARRANGEMENT FOR A PIEZOELECTRIC ACTUATOR FOR A FUEL INJECTION VALVE OF AN INTERNAL COMBUSTION ENGINE

(75) Inventors: Klaus Plecher, Zeitlarn (DE); Marcus Unruh, Zeitlarn (DE); Andreas Voigt, Regensburg (DE)

(73) Assignee: Siemens Aktiengesellschaft, Munich (DE)

( * ) Notice: Subject to any disclaimer, the term of this patent is extended or adjusted under 35 U.S.C. 154(b) by 653 days.

(21) Appl. No.: 10/963,466

(22) Filed: Oct. 11, 2004

(65) Prior Publication Data

US 2006/0038032 A1 Feb. 23, 2006

Related U.S. Application Data

(60) Provisional application No. 60/603,326, filed on Aug. 20, 2004.

(30) Foreign Application Priority Data

Aug. 20, 2004 (DE) .................. 10 2004 040 488
Sep. 1, 2004 (DE) .................. 10 2004 042 353

(51) Int. Cl.
*H02N 2/02* (2006.01)
(52) U.S. Cl. .................................. 310/340; 239/102.2
(58) Field of Classification Search ............. 310/340; 239/102.2
See application file for complete search history.

(56) References Cited

U.S. PATENT DOCUMENTS 5,059,857 A 10/1991 Brandt et al. ............... 310/366

6,917,141 B2 * 7/2005 Freudenberg et al. ....... 310/328
6,974,088 B2 12/2005 Albert et al. ................ 239/88
7,097,484 B2 8/2006 Schurz et al. ............... 439/279

FOREIGN PATENT DOCUMENTS

| DE | 19844742 | | 3/2000 |
| DE | 19844743 | | 6/2000 |
| DE | 198 44 743 | C1 | 1/2001 |
| DE | 10144919 | | 5/2003 |
| DE | 102 51 225 | A1 | 5/2004 |
| DE | 10251225 | * | 5/2004 |
| DE | 10251255 | | 5/2004 |
| DE | 10253956 | * | 6/2004 |
| DE | 102004039673 | | 4/2006 |
| EP | 1420467 | | 5/2004 |
| EP | 1628015 | | 9/2004 |
| WO | 03/069152 | | 8/2003 |

\* cited by examiner

*Primary Examiner*—Darren Schuberg
*Assistant Examiner*—Bryan P Gordon
(74) *Attorney, Agent, or Firm*—Baker Botts L.L.P.

(57) ABSTRACT

A sealing arrangement of a piezoelectric actuator comprises terminal posts (14) projecting from the piezoelectric actuator and a metallic top arrangement (18, 22), provided with openings (28) allowing the passage of the terminal posts (14) which is emplaced on the piezoelectric actuator. In order to facilitate reliable sealing in particular also for comparatively thin top plates (18), the invention provides for emplacing on terminal post sections (30) projecting from the openings (28) a sealing element (32) which is formed from an electrically insulating and sealing material and which is positioned tight against, on the one hand, circumferential areas (34) of the terminal post sections (30) and, on the other hand, the top arrangement (18, 22), with an insulating disk (40) provided with openings allowing the passage of the terminal posts (14) and made of electrically insulating material being located between the sealing element (32) and the top arrangement (18, 22).

20 Claims, 5 Drawing Sheets

Fig. 9

SEALING ARRANGEMENT FOR A PIEZOELECTRIC ACTUATOR FOR A FUEL INJECTION VALVE OF AN INTERNAL COMBUSTION ENGINE

PRIORITY

This application claims priority to U.S. Provisional Application 60/603,326 filed Aug. 20, 2004; German application no. 10 2004 040 488.7 filed Aug. 20, 2004; and, German application no. 10 2004 042 353.9 filed Sep. 1, 2004.

TECHNICAL FIELD OF THE INVENTION

The present invention relates to a sealing arrangement.

DESCRIPTION OF THE RELATED ART

An arrangement of said type is known, for example, from DE 102 51 225 A1. In that prior art, in order to provide a durable, in particular oil-tight seal between a piezoelectric actuator and an external contacting arrangement it is proposed that a fuel-resistant sealing ring (O ring) be inserted into each opening in an emplaced top plate. A collar of insulating material which centers and electrically insulates the terminal post is furthermore emplaced beneath the sealing ring in each passage opening.

This known piezoelectric actuator contacting arrangement disadvantageously requires a comparatively thick top plate for accommodating in each case a sealing ring and a centering collar in its passage openings.

SUMMARY OF THE INVENTION

An object of the present invention is therefore to develop a sealing arrangement of the type mentioned at the beginning in such a way as to facilitate reliable sealing in particular also for comparatively thin top plates.

The sealing arrangement according to the invention provides for emplacing a sealing element made of an electrically insulating and sealing material on terminal post sections projecting from the openings, said sealing element being positioned tight against, on the one hand, circumferential areas of the terminal post sections and, on the other hand, the top arrangement, with an insulating disk provided with openings that allow the passage of the terminal posts and made of electrically insulating material being located between said sealing element and top arrangement.

Reliable sealing is enabled through the sealing element's being positioned tightly against both the circumferential areas of the terminal post sections and the top arrangement. Said sealing lies outside the structural space delimited by the passage openings so as to provide greater freedom of structural design in terms of the sealing element independently of said delimited structural space of the passage openings and, furthermore, so that said sealing is suitable in particular also for comparatively thin top plates. Being positioned against both the terminal posts and the metallic top arrangement, said sealing element must be made of an electrically insulating and sealing material. The more or less severe practical difficulty thus arises concerning the choice of material of finding one that both seals well and electrically insulates well. The use of the sealing element in a fuel injector of an internal combustion engine moreover frequently calls for good media resistance (for example to an internal combustion engine's fuel and/or lubricating oil) as well as a high thermal loading capacity. Materials that meet all these requirements tend to be expensive.

Said problem concerning the choice of material is, however, considerably alleviated or, as the case may be, resolved according to the invention owing to the fact that an insulating disk made of electrically insulating material (polyamide, for example) and likewise provided with openings allowing the passage of the terminal posts is located between the sealing element and top arrangement. This additional measure substantially reduces the requirements placed on the sealing element material in terms of its insulating properties because, in particular, comparatively short electrical paths between a terminal post and the metallic top arrangement are ruled out by the interposed insulating disk or, as the case may be, are suppressed in terms of their contribution to conductivity owing to the interposed insulating material. The interposed insulating disk is therefore suitable for substantially increasing the electrical resistance between a terminal post and the top arrangement and hence also the electrical resistance between the terminal posts. The sealing element material can advantageously be selected principally with a view to optimal sealing on the terminal post sections (radial sealing) and on the top arrangement (axial sealing). An elastomer, for example, can in particular be selected as the material for the sealing element. The sealing element can be formed from, for instance, polyurethane, an "FKM" type elastomer such as, for example, Viton (trade name), or a type "NBR" elastomer etc.

To ensure reliable axial sealing, the sealing element can be pressed axially toward the top arrangement for example at least in an area annularly surrounding the terminal posts.

Pressing of said type in the area of axial sealing can be provided by, for example, the exertion of axial pressure by a contact module, located at one end of the injector housing, for electrically connecting the injector. One embodiment provides for the contact module to press the sealing element, at least in sections, against the top arrangement. These sealing element sections thus clamped, as it were, between the contact module and top arrangement can then provide the axial sealing. The sealing element is preferably embodied in single-piece disk form and positioned in a tight manner annularly around the circumference of the top arrangement. Said axial sealing can be provided in a simple manner by clamping an annularly closed sealing element area between the contact module and top arrangement. The sealing element will be pressed against the top arrangement in a well defined manner if the contact module is provided for this purpose with one or more projections which face the sealing element and which will produce the required pressing of the relevant sealing element sections when the fuel injector is mounted.

Simple contact module mounting able to ensure the just-mentioned pressing of the sealing element will ensue if the contact module encompasses a circumferential area of the top arrangement and is retained on said circumferential area by means of a keyed connection. Said keyed connection can be provided in particular as a latching connection in such a manner that, when pushed on, the contact module will engage in a latching manner with the top arrangement. Said latching connection can be provided, for example, annularly continuously around the circumference or by means of a plurality of separate latch areas disposed around the circumference.

One preferred embodiment provides for the sealing element to be applied having elastic pre-tensioning to the circumferential areas of the terminal post sections. This can be realized in a simple manner owing to the sealing element's being formed from elastic material having openings allowing the passage of the terminal posts and to the fact that, when the sealing element is in the relaxed state, the cross-sectional area of each opening is smaller than the cross-sectional area of the relevant terminal post section in the area of radial sealing.

The sealing element will be of compact design when, for instance, it is embodied overall in disk form, wherein, in order to achieve particularly reliable radial sealing, sealing element sections can also be provided which extend from the disk plane axially along the terminal post sections (encompassing said sections). It is possible with this design to achieve an enlarged radial sealing area and/or an increased radial sealing force resulting from elastic pre-tensioning of the sealing element material.

One preferred embodiment provides for the insulating disk to have collar extensions projecting axially into the openings in the top arrangement. Said collar extensions can thus in a simple manner serve to center the terminal posts in the passage openings in the top arrangement and/or to electrically insulate said terminal posts from the metallic top arrangement. It is preferable here for the insulating disk to be embodied as a single piece with the collar extensions projecting therefrom.

There is a preferred use of the sealing arrangement according to the invention for the piezoelectric actuator of a fuel injector for an internal combustion engine with direct injection where the fuel injector and at least one further component of a fuel injection device are located essentially completely inside an engine block module of the internal combustion engine. This relates in particular to the case where injection device components which could readily be located outside the engine block module with no restrictions on their operation are housed inside said engine block module. The term "engine block module" here refers to the totality of components containing engine lubricating oil, hence to the "engine block" in the narrower sense and to appended parts (such as, for example, a cylinder head cover etc.) in which the lubricating oil is pumped or spread or ducted (back). There is an increased risk with this type of engine design of the ingress of damaging media such as oil and/or fuel into the interior of an injector housing. This problem is associated particularly with common-rail diesel engines having injection components located inside the cylinder head cover.

It has proved disadvantageous for an engine design of this type in terms of the durability or, as the case may be, useful life of the piezoelectric actuator if the piezoelectric actuator is enclosed as hermetically gas-tight as possible without any "air gaps". Rather it has proved advantageous if cavities are present within the sealed actuator chamber in the case of a piezoelectric actuator which is operated in an installation environment containing "damaging media" and which is enclosed as hermetically as possible.

It is very easily possible with a sealing arrangement according to the invention to provide or to enlarge cavities of this type inside the sealed actuator chamber. One embodiment, for instance, provides for the insulating disk to have recesses, in particular recesses for promoting an exchange of gas between the axially opposite sides of the insulating disk. Said recesses in the insulating disk alone create cavities. If cavities additionally exist in or are provided above or below the insulating disk, the recesses traversing the insulating disk will create a larger, connected cavity space having an advantageous impact on the durability of the piezoelectric actuator.

The above-mentioned recesses in the insulating disk can be provided in the form of, for instance, passage openings in the body of the insulating disk. If the insulating disk has the collar extensions already mentioned above projecting into the passage openings in the top arrangement, the recesses can also extend axially through said collar extensions and/or, even more simply, along the outer circumferential edge of said collar extensions.

An especially compact embodiment provides for the insulating disk's end face facing the top arrangement to substantially follow the contour of the top arrangement. A cavity benefiting the piezoelectric actuator's durability can thereby also be created by means of a narrow gap between the insulating disk and top arrangement.

Another embodiment provides for said end face of the insulating disk to be kept for the most part axially at a distance from the top arrangement. This latter measure is advantageous especially in conjunction with the recesses for promoting the exchange of gas as said axial distancing can contribute further to enlarging cavities in the actuator chamber. To keep the insulating disk for the most part axially at a distance from the top arrangement, it is possible, for example, to provide physical contact between the insulating disk and the top arrangement only in a circumferential area of the insulating disk with, by contrast, a radially central area of the insulating disk being distanced from the opposite end face of the top arrangement.

The sealing element is preferably embodied in disk form and the end face, facing the insulating disk, of the sealing element preferably substantially follows the contour on the insulating disk. A particularly compact arrangement, for instance, will be achieved thereby.

One preferred embodiment provides for the sealing element to be positioned annularly in a tight manner around the circumference of the top arrangement. Especially when the sealing element is applied in a tight manner only in this circumferential area, the insulating disk can be dimensioned as having a comparatively large area, hence increasing the insulation resistance particularly effectively.

The top arrangement can, in a manner known per se, include a top plate in which are provided the openings in said top arrangement allowing the passage of the terminal posts. It is preferable in this case if the insulating disk extends substantially across the entire end face, facing the insulating disk, of the top plate (with or without axial distancing).

In one preferred embodiment the piezoelectric actuator is enclosed within an actuator chamber formed by a capsule-like actuator housing as well as by the top plate and a base plate located one at each end of said actuator housing. The top plate can here be emplaced at an axial end of the actuator housing and welded thereto, whereas the base plate is in this case located in an axially moving manner within the actuator housing. Within an actuator chamber of said type the piezoelectric actuator can be kept under axial compressive pre-tension in an axially long stretched-out Bourdon spring welded at both ends to the top plate and the base plate. Said base plate can be embodied as part of an action linkage acting on an actuation element of a fuel injection valve. The actuator chamber can be sealed in this area in a manner known per se by a membrane welded into position between the inner wall of the actuator housing and the base plate.

Operational trials conducted in-house by the applicant surprisingly showed that the arrangement of a piezoceramic component, such as the piezoelectric actuator of interest here, in an "as gas-tight as possible" piezoelectric housing arrangement in an installation environment containing damaging media does not in practice prolong the component's useful life but tends rather to shorten it.

By contrast, a substantial prolongation of the durability or, as the case may be, useful life of the piezoelectric actuator can be achieved through a certain "gas permeability" in the area of the sealing arrangement. One possible explanation for this is that when the piezoelectric housing is sealed in as gas-tight a manner as possible, an underpressure will develop (owing, for example, to temperature variations) in the interior space of the housing as a result of which damaging media can pass into the interior space of the housing through the sealing, which in practice cannot be embodied as absolutely hermetic. Other possible explanations are, for example, that after a hermetically sealed piezoelectric drive has been produced the concentration of some or other gas shortening the useful life is increased in the interior of said piezoelectric drive or, as the case may be, that filling the interior space of the housing with a gas resembling atmospheric air has a positive impact on the useful life of the piezoelectric ceramic.

One preferred embodiment therefore provides for the material of the sealing element to have a high gas permeability. A silicon material, in particular a fluoric silicon material, can in particular be selected as said sealing element material (for example elastomers of the "LSR" or "FVMQ" type). Said latter materials facilitate a high permeation rate with respect to gaseous substances such as, for example, air even when the sealing element is comparatively very thick. This property is beneficial to the durability or, as the case may be, useful life of the piezoelectric ceramic of the piezoelectric actuator. Choosing a sealing element material having comparatively high gas permeability will, to an extent, enhance the positive effect of the above-mentioned increase in "actuator chamber volume".

BRIEF DESCRIPTION OF THE DRAWINGS

The invention is described in more detail below with the aid of some exemplary embodiments with reference to the attached drawings, in which.

DETAILED DESCRIPTION OF THE PREFERRED EMBODIMENTS

Figure 1:
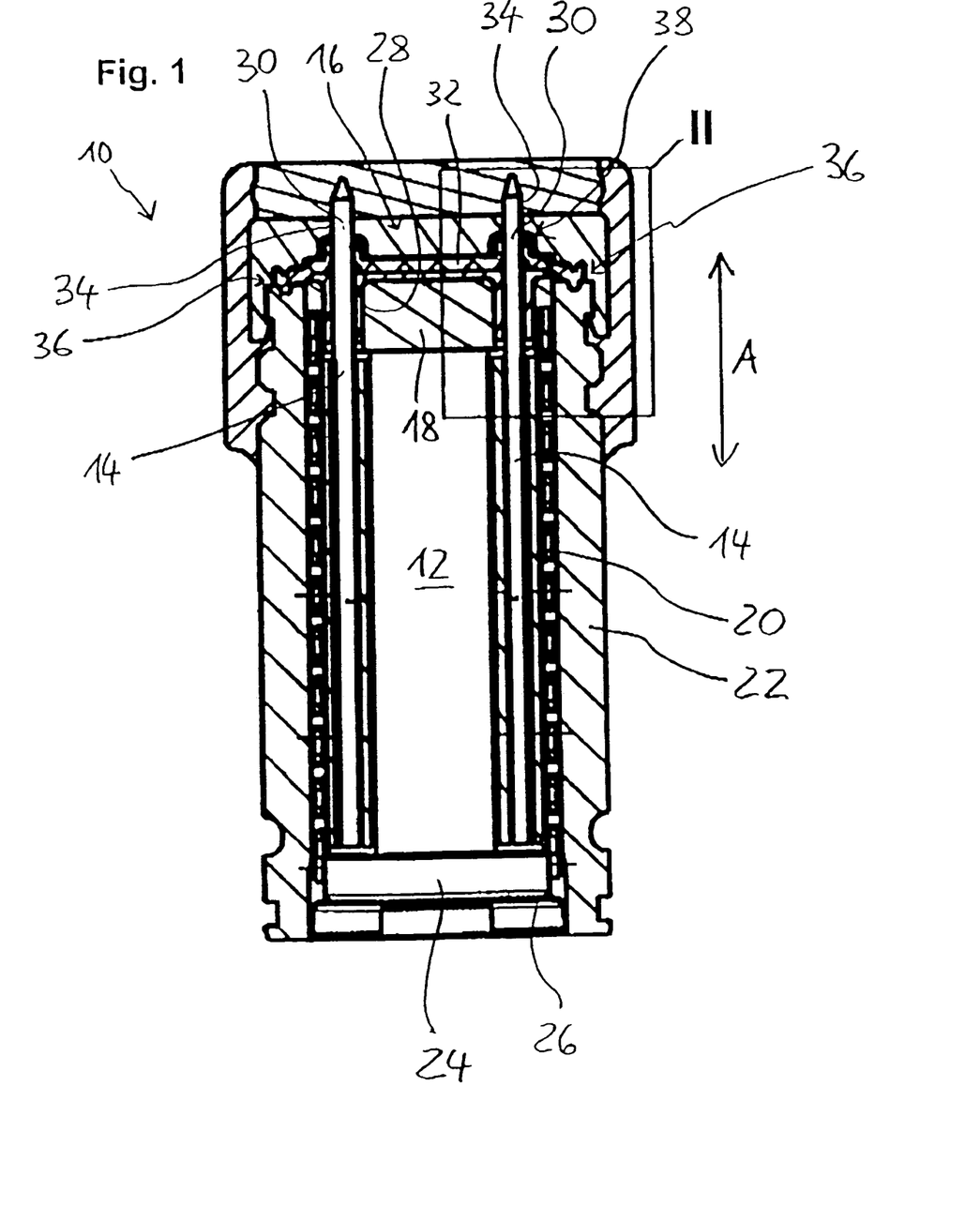
FIG. 1 is an axial longitudinal section of a piezoelectric drive for a fuel injection valve.

FIG. 1 shows a piezoelectric drive, designated overall by the number 10, for actuating the injection valve of the fuel injector of an internal combustion engine. Together with the injection valve (not shown) located beneath the piezoelectric drive 10 in FIG. 1, in the installed condition the piezoelectric drive 10 shown forms the fuel injector.

The piezoelectric drive 10 contains, in a manner known per se, a piezoelectric actuator 12 which is substantially formed from a piezoelectric element stack and which is axially long stretched-out in an axial direction A and whose axial extent can be changed in a controlled manner by applying a control voltage via metallic terminal posts 14.

For electrically connecting the fuel injector, said injector is provided at its top end (in FIG. 1) with a contact module 16 by means of which the terminal posts 14 are electrically connected to contact studs of a plug-in connector (not shown). Said onward electrical connection can be implemented by means of, for example, a contact stud mount welded onto the ends of the terminal posts 14. A contact stud mount of said type is described in, for example, DE 198 44 743 C1.

Also to be seen are a metallic top plate 18, a Bourdon spring 20, and a capsule-shaped actuator housing 22. The piezoelectric actuator 12 is held in the Bourdon spring 20 under axial compressive pre-tension. The Bourdon spring 20 is for this purpose welded at its bottom end to an axially moving base plate 24 located in the actuator housing 22, whereas the opposite, top end of the Bourdon spring 20 is welded to the circumference of the top plate 18.

The actuator unit formed from the piezoelectric actuator 12, the top plate 18, the Bourdon spring 20, and the base plate 24 is emplaced in the capsule-shaped actuator housing 22. The bottom end (in the figure) of said actuator housing 22 is sealed by means of a membrane 26. An action linkage is provided in the area of said membrane 26 in a manner known per se between the piezoelectric drive 10 and the fuel injection valve for transmitting the axial change in length of the piezoelectric actuator 12 to an actuation element of the injection valve.

Sealing of the actuator chamber located beneath the top plate 18 against the area of the contact module 16, or synonymously, sealing of the top end of the capsule-shaped actuator housing 22 is provided by a sealing arrangement described in more detail below.

The top plate 18 has openings in the form of axial bores 28 allowing the passage of the terminal posts 14 so that terminal post sections 30 project axially from the bores 28. For sealing the piezoelectric actuator 12 a sealing disk 32 which is formed from an electrically insulating and sealing elastomer and which is positioned tight against, on the one hand, circumferential areas 34 of the post sections 30 and, on the other hand, the top arrangement 18, 22 is emplaced on the terminal post sections 30. In the exemplary embodiment shown, said sealing contact between the sealing disk 32 and the top arrangement 18, 22 is provided annularly encompassing the top end of the actuator housing 22 at 36. Said sealing between the sealing disk 32 and the metallic top arrangement is also designated below as axial sealing 36. This is in contrast to the sealing between the sealing disk 32 and the terminal posts 14, which is designated below as radial sealing 38.

Figure 2:
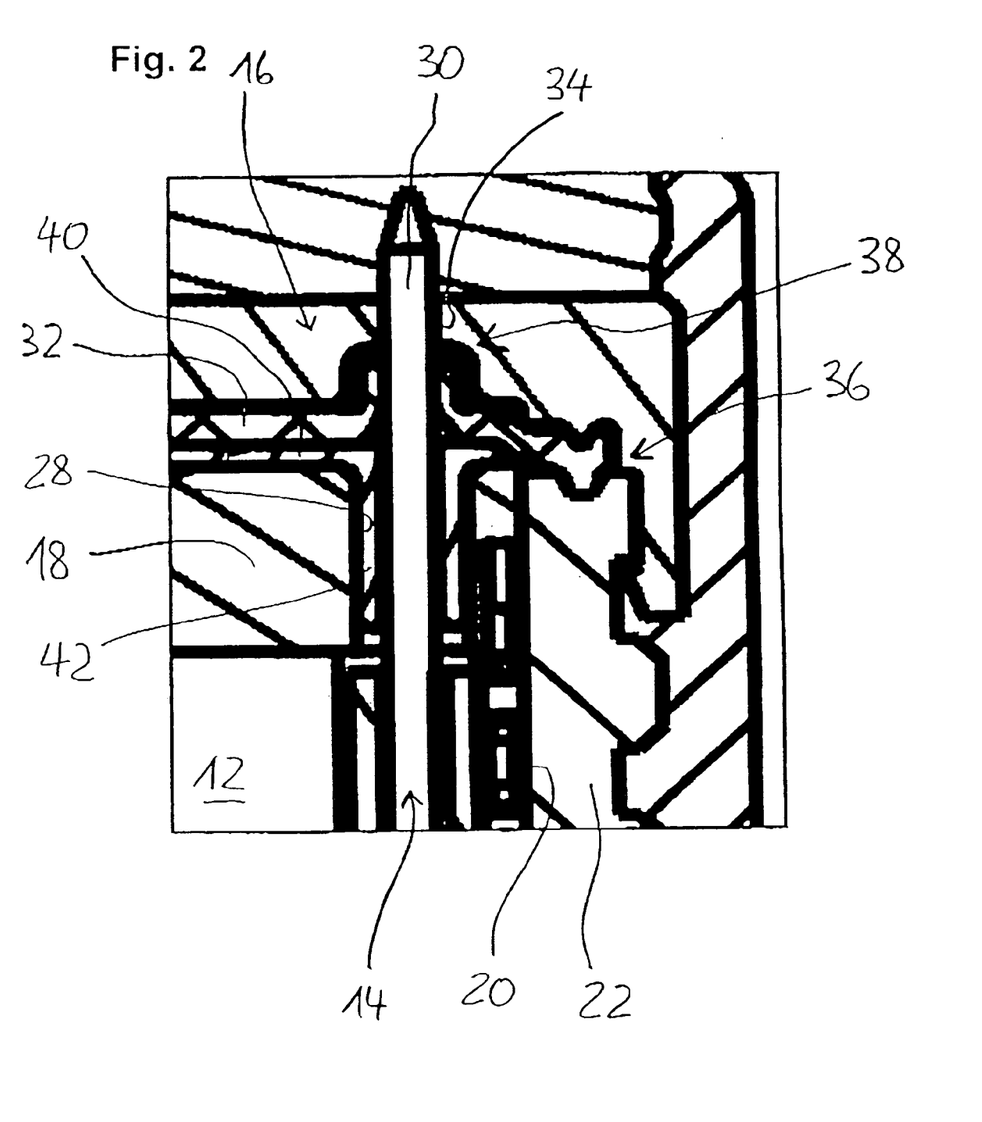
FIG. 2 is a detailed representation of the area designated II in FIG. 1.

Both the axial sealing 36 and the radial sealing 38 can better be seen in the detailed view according to FIG. 2. Said detailed view shows the (in FIG. 1) right-hand area of the overall substantially symmetric sealing arrangement. The (in FIG. 1) left-hand sealing area is structured analogously.

Further to be seen in FIG. 2 is an insulating disk 40, likewise provided with openings allowing the passage of the terminal posts 14, made of an electrically well insulating material. Said insulating disk 40 is located between the sealing disk 32 and the top arrangement 18, 22 and, in the exemplary embodiment shown, extends radially as far as the outer circumferential edge of the top plate 18. Centering of the terminal posts 14 and the electrical insulation thereof from the top plate is provided by collar extensions 42, axially projecting into the bores 28 of the top plate 18, of the insulating disk 40.

The end face, facing the top plate 18, of the insulating disk 40 follows the planar contour of the top plate 18 and is positioned more or less over its entire surface (with a very small gap) against the top side of the top plate 18. The resulting gap increases the effective actuator chamber volume, which is in turn favorable in terms of the long durability of the piezoelectric actuator 12.

The sealing disk 32 formed from an elastomer is likewise embodied overall in disk form, with the end face, facing the insulating disk 40, of the sealing disk 32 extending along the contour (top side) of the insulating disk. There is in practice a certain "air gap" in this case also, which has an advantageous impact on the useful life of the piezoelectric actuator 12.

Only in the area of the passage of the terminal posts 14 does the sealing disk 32 have material sections which extend axially along the circumferential areas 34 of the terminal post sections 30 and on whose top ends is provided in each case one of the two radial seals 38. Said radial sealing 38 is ensured by elastic pre-tensioning of the sealing disk material in this section. By contrast, axial sealing 36 is provided by axial pressing, brought about in a manner not further explained, of at least the outer circumferential area of the sealing disk 32 toward the top end of the actuator housing 22.

While selected to provide optimal sealing against the ingress of liquid, the elastomer material of sealing disk 32 is nonetheless highly gas-permeable. Said material also possesses as low as possible electrical conductivity. This is of importance for electrically insulating the terminal posts 14 from the metallic top arrangement 18, 22 and hence for mutually insulating the contact pins. The electrical insulation resistance is substantially improved owing to the fact that the insulating disk 40, formed from electrically insulating material, is interposed between the elastomer sealing disk 32 and the metallic top plate 18 and thus, to an extent, ensures that the end face, facing the top plate 18, of the sealing disk 32 is "kept away from the top arrangement". In particular, providing the insulating disk 40 eliminates comparatively short electrical paths from the circumferential area 34 of the terminal post 14 through the elastomer material to the top arrangement 18, 22.

Figure 3:
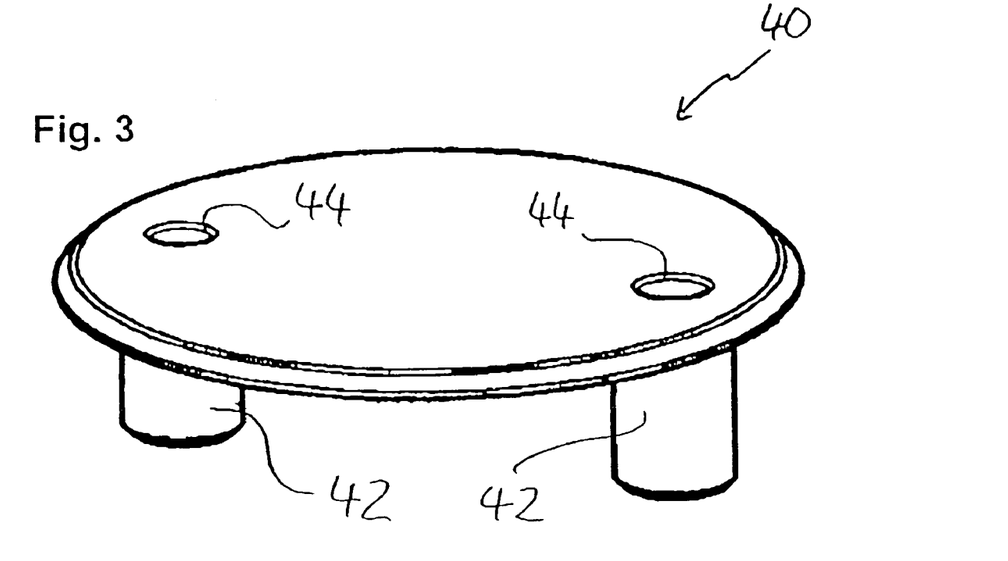
FIG. 3 is a perspective view of an insulating disk used in the piezoelectric drive according to FIG. 1.
Figure 4:
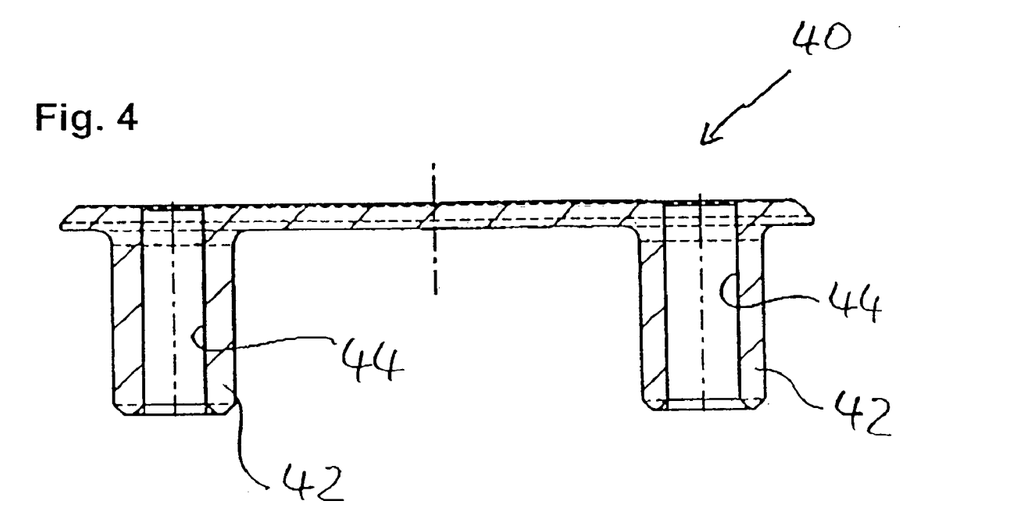
FIG. 4 is a cross-section of the insulating disk.

FIGS. 3 and 4 illustrate the design of the insulating disk 40 having the collar extensions 42 formed as a single piece with them and arranged coaxially to the openings 44 allowing the passage of the terminal posts 14. Said openings 44 are in the mounted condition (FIG. 1) also arranged coaxially to the passage bores 28 in the top plate 18, with which openings the collar extensions 42 mesh. In the exemplary embodiment described, the collar extensions 42 extend substantially across the entire axial extent of the bores 28.

In the description of further exemplary embodiments that follows, the same reference numbers are employed for like components, with each number being supplemented by a lower-case letter to distinguish the respective embodiment. Said description deals for the most part only with departures from exemplary embodiment(s) already described, reference incidentally expressly being made at this point to the description of preceding exemplary embodiments.

Figure 5:
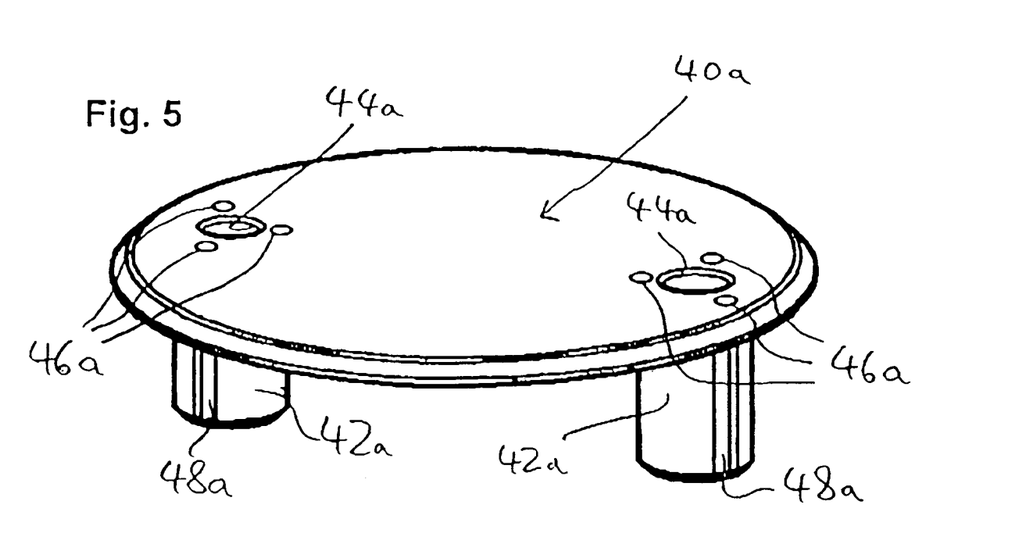
FIG. 5 is a view, corresponding to FIG. 3, of an insulating disk according to a modified embodiment.

FIG. 5 illustrates a modified insulating disk 40*a*. In common with the insulating disk described in the foregoing, the insulating disk 40*a* has collar extensions 42*a* with openings 44*a* allowing the passage of the terminal posts.

Figure 6:
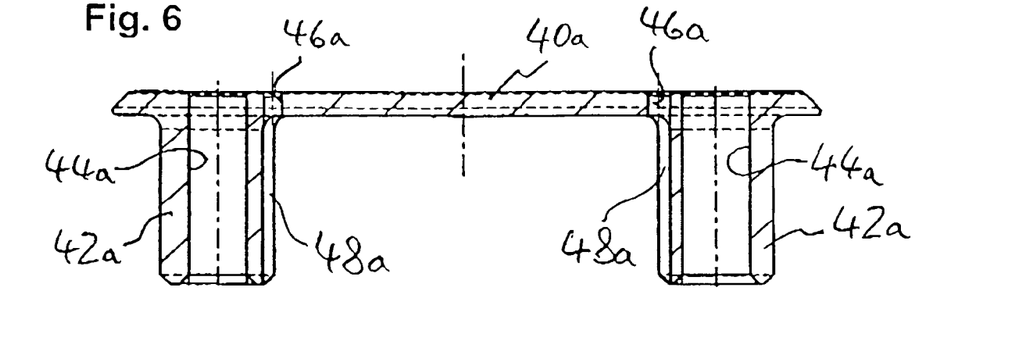
FIG. 6 is a cross-section of the insulating disk.

As a departure from the exemplary embodiment described in the foregoing, ventilation apertures 46*a* are additionally provided which promote an exchange of gas between the axially opposite sides of the insulating disk 40*a*. An exchange of gas of said type is advantageous during operation of the piezoelectric actuator in terms of its durability or, as the case may be, useful life. Ventilation apertures 46*a* of said type could as a basic rule be located anywhere on the insulating disk 40*a*. As regards to the exchange of gas, it must be borne in mind that the material of which the insulating disk 40*a* is made is principally selected for its good electrical insulating properties and, for that reason alone, generally does not have a good sealing effect at the boundary area toward the top plate. In order nonetheless to enhance particularly effectively the capacity to exchange gas between the axially opposite end faces of the insulating disk 40*a* it is preferable—as shown in FIGS. 5 and 6—to locate ventilation apertures 46*a* of said type approximately in the area of the collar extensions 42*a*. A path into the actuator chamber for the exchange of gas is provided particularly in the area of the circumferential area of the collar extensions 42*a* owing to the annular gap located there. To further improve the axial gas throughput rate along said circumferential areas, axial insulating slots 48*a* are provided in the insulating disk 40*a* shown which each lead into one of the ventilation apertures 46*a*.

Both the insulating slots 48*a* and the ventilation apertures 46*a* by themselves already advantageously increase the "volume of air" enclosed within the actuator chamber. Said volume which is advantageous in terms of the piezoelectric actuator's durability can be further increased by a measure shown in FIG. 7.

Figure 7:
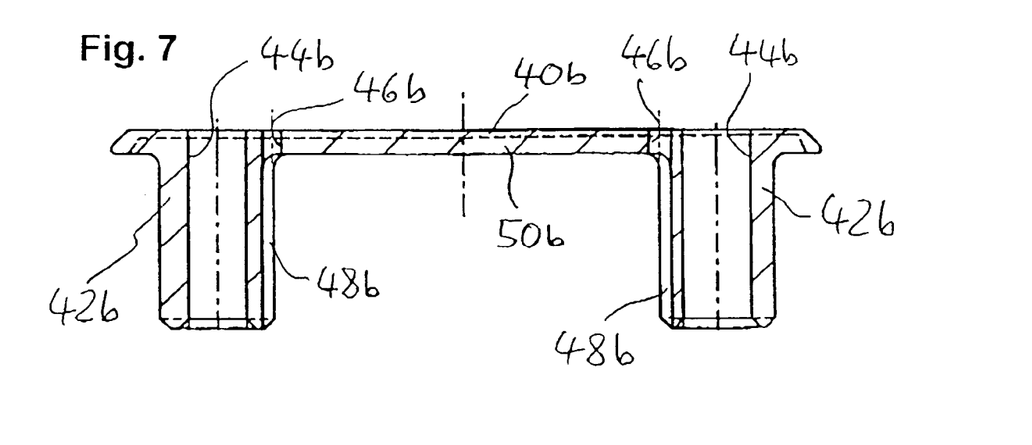
FIG. 7 is a view, corresponding to FIG. 6, of an insulating disk according to a further modified embodiment.

FIG. 7 is a view corresponding to FIG. 6 of a further modified insulating disk 40*b*. Elements 42*b*, 44*b*, 46*b*, 48*b* are similar to elements 42*a*, 44*a*, 46*a*, 48*a* as shown in FIG. 6. Said insulating disk 40*b* is embodied in such a way that in the mounted condition, for example in an installation environment according to FIG. 1, it is not positioned over its entire surface with its bottom end face against the top end face of the top plate. This is achieved by means of a downwardly offset circumferential area of the insulating disk 40*b* or, as the case may be, by means of a recess 50*b* on the underside of said insulating disk 40*b* extending radically not quite to the circumferential edge of the insulating disk 40*b*. In the mounted condition the end face, facing the top arrangement, of the insulating disk 40*b* is thus kept for the most part (in a central area) axially at a distance from the top arrangement. Said axial distancing is synonymous with an enlargement of the effective actuator chamber.

Figure 8:
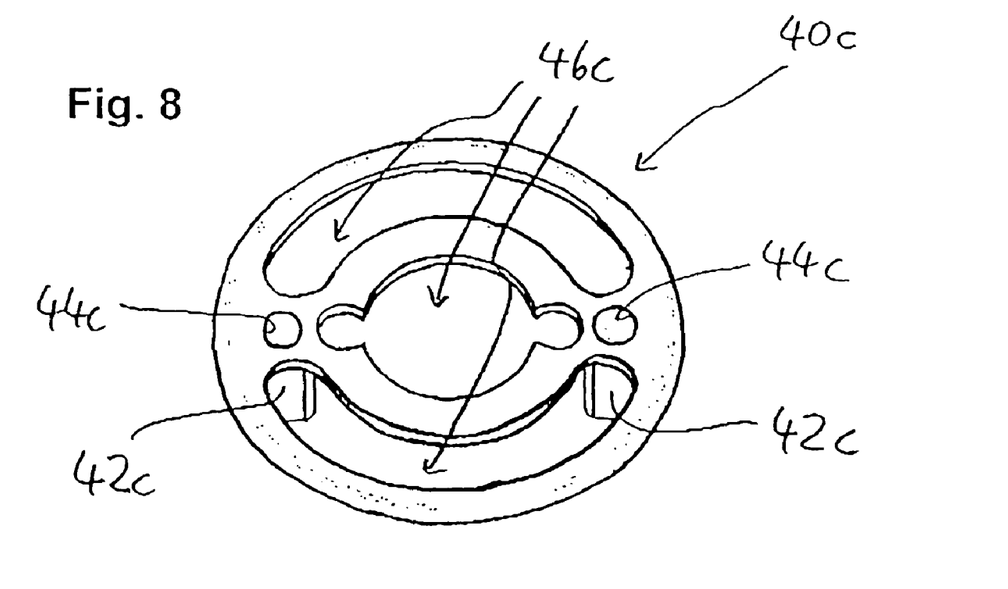
FIG. 8 is a perspective view (from above) of an insulating disk according to a further embodiment.
Figure 9:
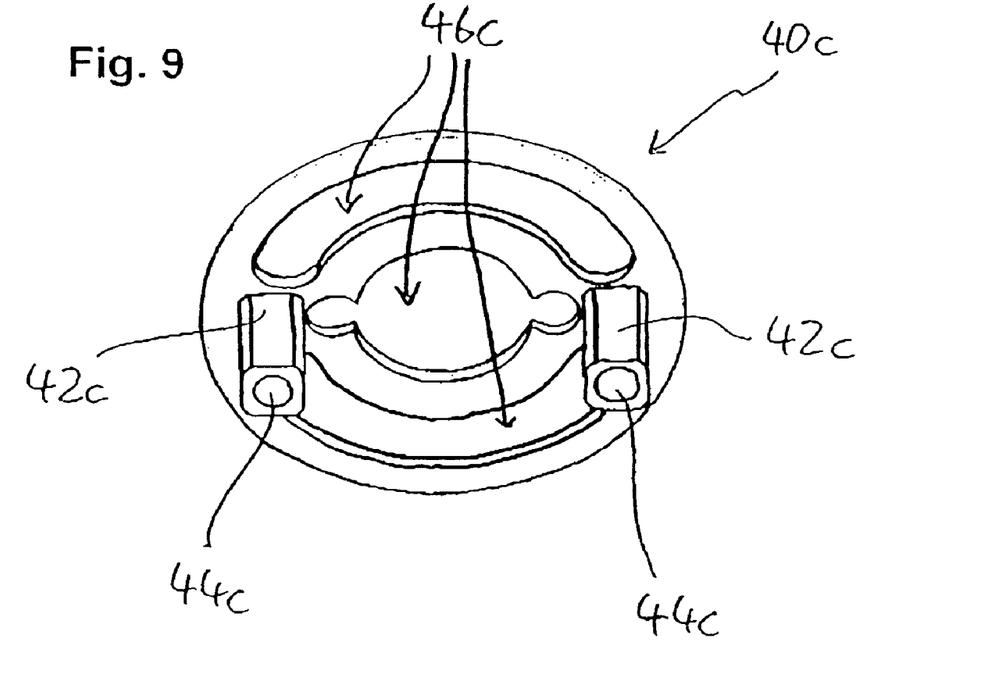
FIG. 9 is a perspective view (from below) of the insulating disk shown in FIG. 8.

FIGS. 8 and 9 illustrate a further embodiment of an insulating disk 40*c* suitable for the sealing arrangement according to FIG. 1. Element 44*c* is again similar to element 44*a* or 44*b* as shown in FIGS. 6 and 7. In this embodiment, ventilation apertures 46*c* are embodied on this molded-plastic component as large-area openings whose surface area is around 50% the overall area of the body of the disk. A yet further improved gas permeability and enlargement of the effective actuator chamber volume is created thereby. A further departure from the embodiments described in the foregoing is that collar extensions 42*c* molded on for insulation meshing into the bores in the top plate have an approximately rectangular (in this case: square) cross-sectional contour so that when said collar extensions 42*c* are in place in each case four particularly extended gaps are produced between the outer sides of the collar extensions 42*c* and the inner wall of the relevant bore. Good centering and electrical insulation are provided thereby, accompanied by ease of production.

The described embodiments of a sealing arrangement of a piezoelectric actuator are especially suitable for, for example, a diesel injector, integrated in the cylinder head of an engine, of a common-rail system in which the onward electrical connection connecting to the terminal posts is likewise accommodated within the cylinder head. The described sealing arrangements effectively counteract a damaging influence in this particular installation environment. The arrangement according to the invention is suitable in particular also for injectors having no sealing on the connector side (on the contact module).

There is furthermore improved electrical insulation as the sealing element used for sealing is not positioned directly against the top plate but is separated therefrom at least in sections by the insulating disk.

The insulating disk used can be produced particularly economically from plastic as an injection-molded part and, by means of the collar extensions, can at the same time insulate in the area of the top plate. Using an insulating disk of said type gives greater freedom of choice of material for the sealing element as the electric current is compelled to take a "detour" depending on the geometric design of the insulating disk. The electrical resistance between the terminal posts and a top arrangement as well as the electrical resistance between the terminal posts can be effectively increased.

The advantageous actuator chamber volume can be increased by the presence alone of an insulating disk of said type through the provision of more or less large gaps between an insulating disk of said type and bordering components such as, for example, top plate and sealing element. Gaps of said type are in practice often produced perforce.

Said actuator chamber volume can be further increased by the arrangement of the described additional recesses and cavities. The improved insulation tends also to raise the endurance strength of the piezoelectric actuator as it does not lose charge in a non-specific manner through electrical leakage currents and (temporary) electrical shorting. Increasing the actuator chamber volume also brings about a reduction in pressure peaks, which can be caused by, for example, temperature variations, while the piezoelectric actuator is operating.

The invention claimed is:

1. A sealing arrangement of a piezoelectric actuator for a fuel injection valve of an internal combustion engine comprising:
   terminal posts projecting from said piezoelectric actuator,
   a metallic top arrangement emplaced on said piezoelectric actuator provided with openings allowing the passage of said terminal posts,
   a sealing element emplaced on terminal post sections projecting from the openings, wherein the sealing element is formed from an electrically insulating and sealing material, which is positioned tight against, on the one hand, circumferential areas of the terminal post sections and, on the other hand, the top arrangement, with an insulating disk provided with openings that allow the passage of said terminal posts and made of electrically insulating material being located between said sealing element and top arrangement.

2. The sealing arrangement according to claim 1, wherein the insulating disk has collar extensions projecting axially into the openings in the top arrangement.

3. The sealing arrangement according to claim 2, wherein at least one gap remains in each case between the collar extensions and the openings.

4. The sealing arrangement according to claim 1, wherein the insulating disk has recesses for promoting an exchange of gas between the axially opposite sides of said insulating disk.

5. The sealing arrangement according to claim 1, wherein the end face, facing the top arrangement, of the insulating disk substantially follows the contour of said top arrangement.

6. The sealing arrangement according to claim 1, wherein the end face, facing the top arrangement, of the insulating disk is kept for the most part axially at a distance from said top arrangement.

7. The sealing arrangement according to claim 1, wherein the sealing element is formed from an elastomer.

8. The sealing arrangement according to claim 1, wherein the sealing element is embodied in disk form and wherein the end face, facing the insulating disk, of said sealing element substantially follows the contour of said insulating disk.

9. The sealing arrangement according to claim 1, wherein the sealing element is positioned in a tight manner annularly around the circumference of the top arrangement.

10. The sealing arrangement according to claim 1, wherein the top arrangement includes a top plate in which are provided the openings in said top arrangement allowing the passage of the terminal posts.

11. The sealing arrangement according to claim 10, wherein the insulating disk extends substantially across the entire end face, facing the insulating disk, of the top plate.

12. The sealing arrangement according to claim 10, wherein a capsule-like actuator housing, together with the top plate and a base plate located one at each end of said actuator housing, bounds an actuator chamber accommodating the piezoelectric actuator.

13. The sealing arrangement according to claim 1, wherein the sealing element is positioned in a tight manner against the axial end of a capsule-like actuator housing.

14. A sealing arrangement of a piezoelectric actuator for a fuel injection valve of an internal combustion engine comprising:
    terminal posts projecting from said piezoelectric actuator,
    a metallic top arrangement emplaced on said piezoelectric actuator provided with openings allowing the passage of said terminal posts,
    a sealing element emplaced on terminal post sections projecting from the openings, wherein the sealing element is formed from an electrically insulating and sealing material, which is positioned tight against, on the one hand, circumferential areas of the terminal post sections and, on the other hand, the top arrangement, with an insulating disk comprising openings that allow the passage of said terminal posts, collar extensions projecting axially into the openings in the top arrangement, and made of electrically insulating material, wherein the insulating disk is located between said sealing element and top arrangement, and wherein at least one gap remains in each case between the collar extensions and the openings.

15. The sealing arrangement according to claim 14, wherein the insulating disk has recesses for promoting an exchange of gas between the axially opposite sides of said insulating disk.

16. The sealing arrangement according to claim 14, wherein the end face, facing the top arrangement, of the insulating disk substantially follows the contour of said top arrangement.

17. The sealing arrangement according to claim 14, wherein the end face, facing the top arrangement, of the insulating disk is kept for the most part axially at a distance from said top arrangement.

18. The sealing arrangement according to claim 14, wherein the sealing element is formed from an elastomer.

19. The sealing arrangement according to claim 14, wherein the sealing element is embodied in disk form and wherein the end face, facing the insulating disk, of said sealing element substantially follows the contour of said insulating disk.

20. The sealing arrangement according to claim 14, wherein the sealing element is positioned in a tight manner annularly around the circumference of the top arrangement.

* * * * *